United States Patent [19]
Lee

[11] Patent Number: 5,620,927
[45] Date of Patent: Apr. 15, 1997

[54] SOLDER BALL ATTACHMENT MACHINE FOR SEMICONDUCTOR PACKAGES

[75] Inventor: Shaw W. Lee, San Jose, Calif.

[73] Assignee: National Semiconductor Corporation, Santa Clara, Calif.

[21] Appl. No.: 449,950

[22] Filed: May 25, 1995

[51] Int. Cl.⁶ .................................................. H01L 21/60
[52] U.S. Cl. .................. 29/841; 438/126; 228/180.22
[58] Field of Search .................................. 437/183, 192, 437/203, 209, 211, 214, 217, 219

[56] References Cited

U.S. PATENT DOCUMENTS

| | | | |
|---|---|---|---|
| 4,857,482 | 8/1989 | Saito et al. | 437/209 |
| 5,066,614 | 11/1991 | Dunaway et al. | 437/217 |
| 5,162,264 | 11/1992 | Haug et al. | 437/209 |
| 5,289,346 | 2/1994 | Carey et al. | 437/209 |
| 5,474,957 | 12/1995 | Urushima | 437/211 |
| 5,498,576 | 3/1996 | Hotchkiss et al. | 437/209 |
| 5,508,230 | 4/1996 | Anderson et al. | 437/183 |

*Primary Examiner*—Kevin Picardat
*Attorney, Agent, or Firm*—Hickman Beyer & Weaver

[57] ABSTRACT

A method and apparatus of attaching solder balls for semiconductor packages is disclosed herein. In a first embodiment, a stencil, having a hole array that matches with a solder ball array on a substrate, is fitted into stencil holder which is inserted the housing of the attachment apparatus. A prefluxed molded substrate strip is inserted into the main station directly above the stencil in the holder. A multiplicity of preformed solder balls are rolled from a reservoir across the stencil hole array thereby filling each of the holes. Vacuum may be used with a modified stencil design to assist in drawing the balls in the holes. An operator or pattern recognition camera may be employed to detect any missing solder balls where corrective action can be immediately taken. After the solder balls have been properly positioned relative to the substrate strip, the solder may be reflowed to attach the balls to the substrate. The described apparatus is relative inexpensive and flexible enough to accommodate various substrate sizes and types of packages.

13 Claims, 6 Drawing Sheets

SOLDER BALL ATTACHMENT MACHINE FOR SEMICONDUCTOR PACKAGES

BACKGROUND OF THE INVENTION

This invention relates generally to the attachment of solder balls to semiconductor packages such as ball grid arrays. More particularly, it relates to methods and apparatus for the accurate placement and alignment of solder balls by positioning them in the hole array of a stencil prior to attachment to a substrate.

As technology advances, the complexity, functionality and speed of integrated circuit (IC) chips is steadily increasing. These increasingly complex, high speed IC chips often require correspondingly increasing numbers of electrical interconnections due to their increased functionality. Consequently, high density interconnect package assemblies and the trend toward miniaturization have been principal objectives of semiconductor manufacturers. To this end, there have been semiconductor packages that have been developed with these objectives in mind. One such example is a ball grid array (BGA), which is diagrammatically illustrated in FIGS. 1a and 1b. As seen therein, an integrated circuit die 2 is affixed and bonded to a substrate 4 which is then covered with a cap 7 to provide protection from the outside environment. FIG. 1b is a bottom view of the package of FIG. 1a showing the array of solder balls. The solder balls permit a relatively high interconnect density to be incorporated in a package having a relatively small footprint. The solder balls 8 are formed in a dense pattern of a grid array 8 along the bottom surface of substrate 4 and are arranged to be received on a circuit board having corresponding electrical contacts, for example.

In manufacturing semiconductor packages that utilize arrays of solder balls such as ball grid arrays (BGAs), one of the major difficulties is accurately aligning and attaching the solder balls to the bottom of the substrate in a way that is efficient and avoids costly rework for defective packages. Various solder ball attachment machines have been used in the past which tend to be very expensive thereby limiting their widespread use. Some of these machines incorporate a high level of automation and are very complex. These may also utilize vacuum assist to pick and place whole arrays of solder balls simultaneously in an effort to meet high production requirements. The cost of these machines are typically in the range of $100,000 to $400,000 and the price of some highly automated machines run even higher if they include an optical sensing system that include cameras to detect missing balls prior to attachment.

These solder ball attachment machines often operate by first applying a controlled thickness of flux to a molded BGA substrate strip typically by means of a "doctor blade." A vacuum pickup head is then lowered into a vibrational pot containing a reservoir of preformed solder balls where the head is designed to simultaneously pickup a complete array of solder balls. A vacuum is present to draw the solder balls into an array of holes in the head, the holes are sized so that only one ball fits in each hole which are held in place by the vacuum until released on the substrate.

A camera system is used to detect missing balls in the array or locations where the head happened to miss picking up balls. If a defect is detected, the balls are promptly released and the pickup is reinitiated. If all of the balls are present, the pickup head moves to a fluxing station where the solder balls are be dipped into a controlled flux layer. The pickup head then moves to the substrate strip and transfers the solder balls onto the individual landing pads on each individual unit. The operation is continued in a fixed progression for subsequent strips until all solder balls are attached to the strip. The strip is subsequently moved to a furnace for solder reflow.

Although the described system works fairly well, there have some reliability problems in the past with their use. Most notably, the vacuum pickup head will shut down when flux is inadvertently drawn into the nozzle during the dipping operation at the flux station. Lost production due to machine down time is very costly and must be avoided. Cost is also a major factor that precludes widespread use of a fully automated system which can run upwards to a half a million dollars. What is needed is a relatively inexpensive solder ball attachment system that is accurate, reliable, and able to be outfitted for mass production.

SUMMARY OF THE INVENTION

To achieve the foregoing in accordance with purpose of the present invention, an apparatus and method for solder ball attachment for semiconductor packages, is disclosed herein. In one apparatus aspect of the present invention, a solder ball attachment apparatus includes a main station or housing having a stencil patterned with an array of holes which is received in a stencil holder and inserted into the housing. A reservoir containing preformed solder balls is integrated into the main station so that the solder balls can roll across the stencil filling each of the holes in the array. The stencil holes are sized so that only one ball will fit into each hole in the array. After all array holes are filled with balls, a prefluxed substrate strip is placed in the holder which is superimposed and aligned over the stencil and solder balls. The substrates can then be place in a magazine for collective processing and bonding to the substrate. The apparatus may include various levels of automation, such as, insertion, fluxing, and removal of substrate strips during the process. An optional camera recognition system for the detection of defective packages containing missing solder balls can be incorporated for more efficient operation.

In a method aspect of the present invention, a stencil patterned with an array of holes is received in a stencil holder which together is received in the apparatus housing. The array of holes are filled with solder balls from a reservoir. A substrate strip is positioned a controlled distance from the stencil thereby aligning the solder balls with the landing pads on the substrate. Vacuum pickup may be incorporated into the assembly to assist in drawing the solder balls into the holes. An optional pattern recognition camera may be used to detect missing balls in the array thereby allowing corrective action to be taken on the spot. If no defects are detected, the balls are then pressed and locked against the substrate by the closed lid. The ball attachment apparatus is then turned upside down and the strip is released and seated on the under side of the lid after the lid has been opened. In one embodiment, the apparatus may be attached to a two dimensional tilt table that provides an automated rocking motion to aid in filling the stencil holes with solder balls. The strip is then moved to a magazine and subsequently moved to a furnace for attachment and further processing.

BRIEF DESCRIPTION OF THE DRAWINGS

The invention, together with further objects and advantages thereof, may best be understood by reference to the following description taken in conjunction with the accompanying drawings in which:

FIG. 1b is a diagrammatic bottom view of the ball grid array package illustrated in FIG. 1a.

DETAILED DESCRIPTION OF THE PREFERRED EMBODIMENTS

The present invention relates to a solder ball attachment machine that utilizes a stencil to organize an array of solder balls that are used in semiconductor packages. The described solder ball attachment machines may either be outfitted for manual low production use or adapted to incorporate automation for higher production use.

Figure 1A:
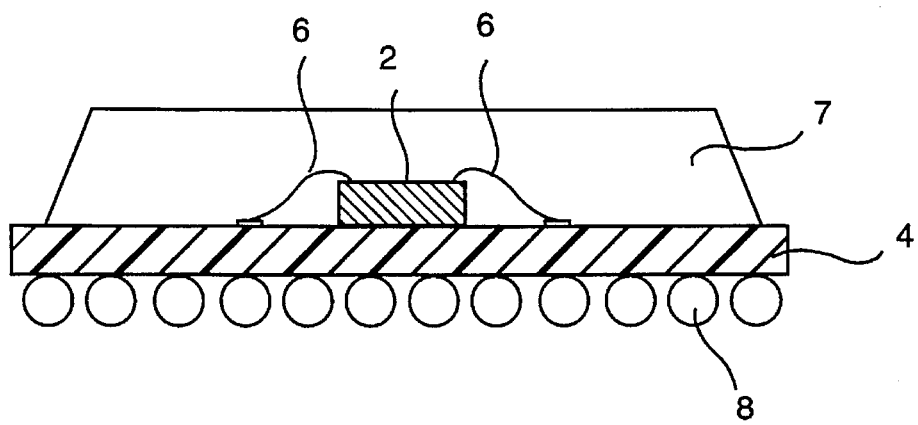
FIG. 1a is a diagrammatic side view of a ball grid array package.
Figure 1B:
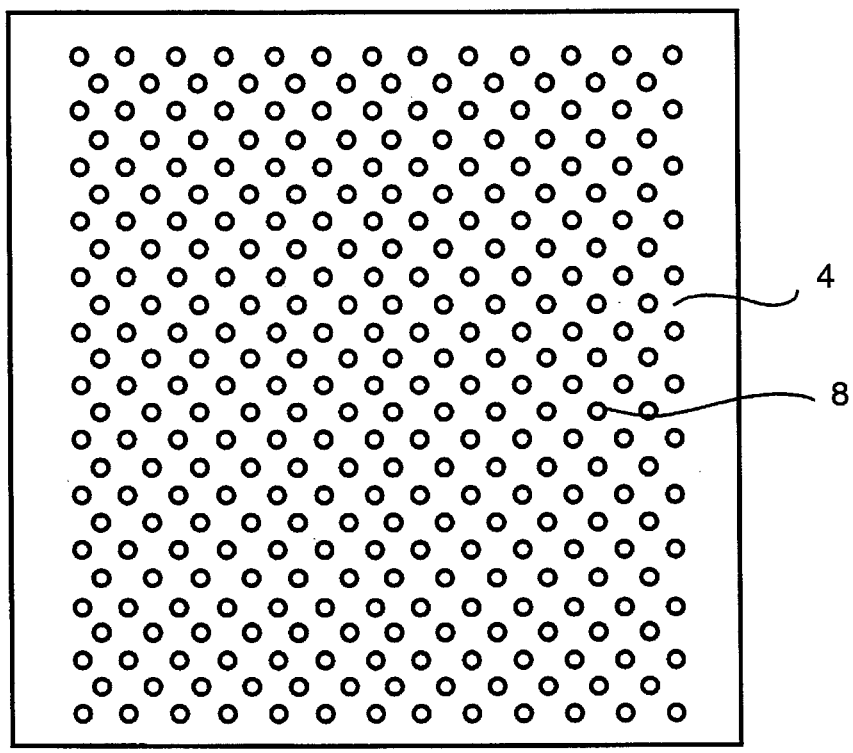
Figure 2:
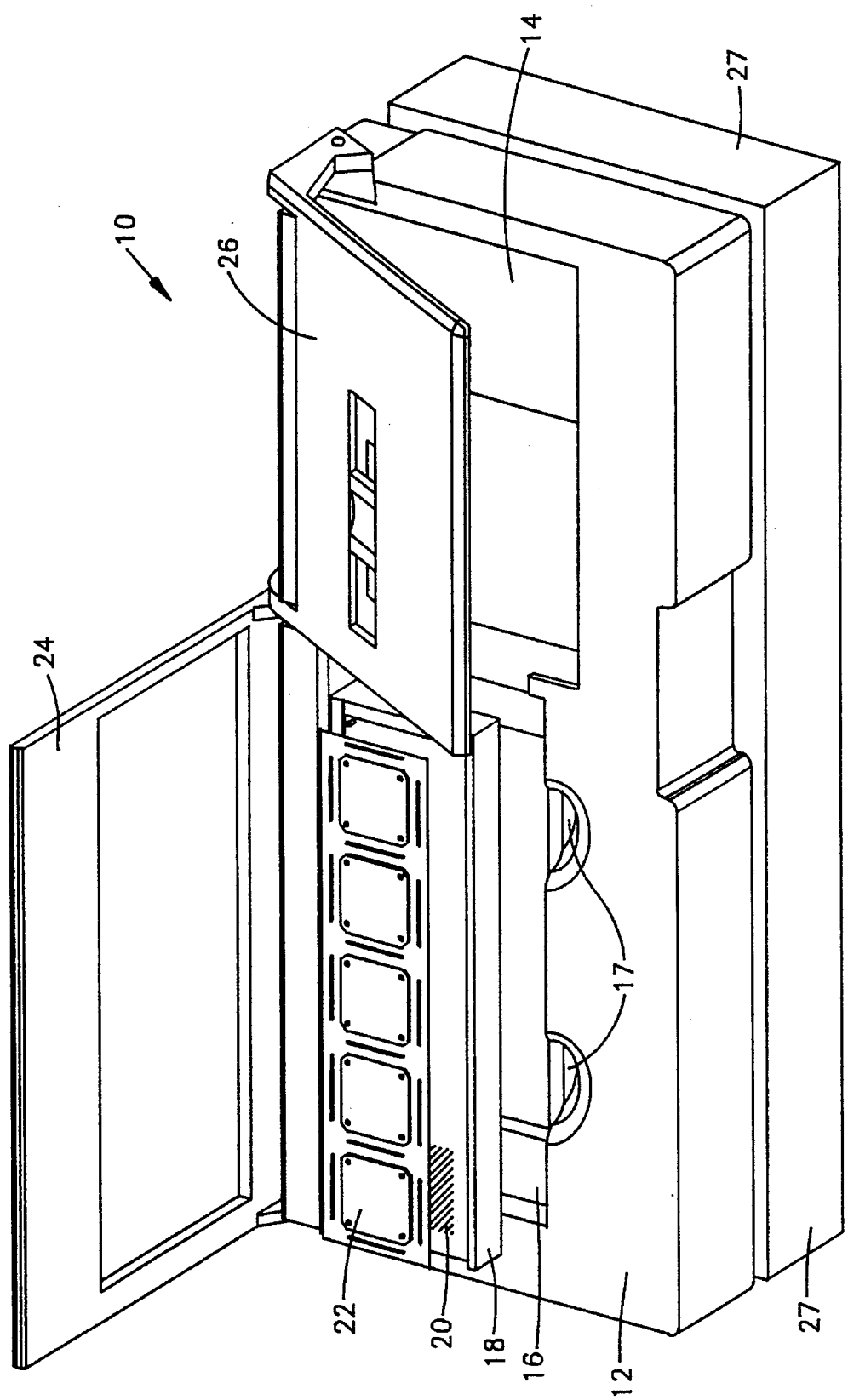
FIG. 2 is a diagrammatic partially exploded perspective view of a solder ball attachment machine in accordance with a first embodiment of the present invention.

Referring initially to FIG. 2, a solder ball attachment machine designed in accordance with a first embodiment of the present invention is shown and designated by reference numeral 10. The attachment machine includes a main station or housing 12 having a reservoir 14 integrated therein. A receptacle 16 in the housing 12 is formed to receive a stencil holder 18 where a pair of finger indents 17 are formed in the sides of the receptacle to aid in the removal of the holder from housing 12. A stencil 20 patterned with an array of holes is received in the stencil holder 18. The reservoir 14, used to store preformed solder balls, is designed so that the solder balls can readily roll out of the reservoir and across the stencil 20 filling each of the holes in the array. The stencil holes are sized so that only one ball will fit into each hole in the array. Once all of the holes are filled, a prefluxed substrate 22 is aligned over of stencil 20 inherently aligning the balls to the correct positions on the substrate 22.

An assembly lid 24 having a see through window 25 is pivotally connected to the housing at a location such that it may be closed to secure the substrate in place. Reservoir lid 26 is also pivotally connected to the housing at a location such that it may be latched closed to secure the solder balls inside of the reservoir 14. With both lids closed, the attachment machine may be turned over and assembly lid 24 may then be opened to remove the stencil holder and substrate which can be moved to a magazine for further processing and reflowing of the solder balls. The solder ball attachment machine may be optionally attached to an automated two-dimensional tilt table 27 that provides a horizontal motion to automate the procedure of filling the stencil holes. The machine may also incorporate various levels of automation, such as, vacuum assist, movement of substrate into or out of the machine, fluxing of substrate, for example. Further, an optional camera recognition system (not shown) for the detection of any missing solder balls in the arrays can be incorporated for more efficient operation.

Figure 3:
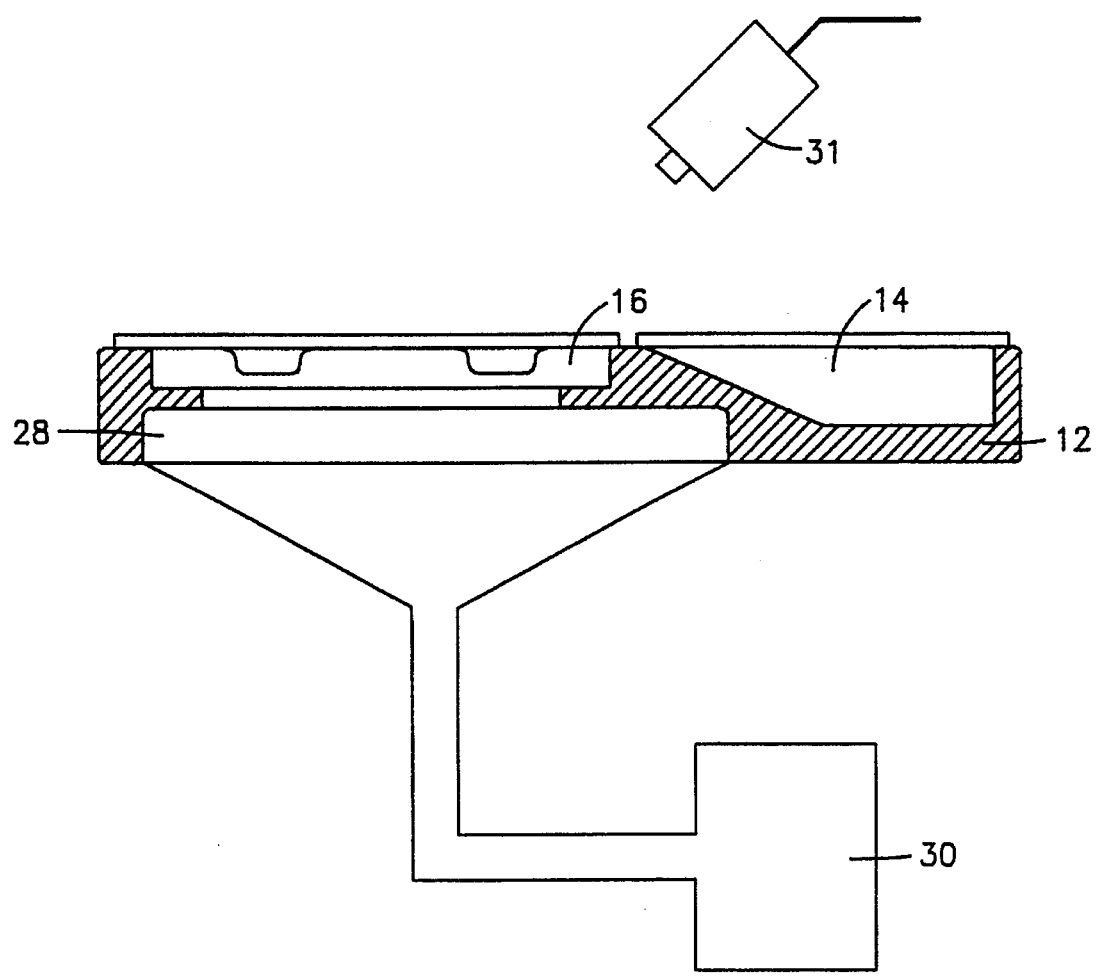
FIG. 3 is a diagrammatic side view of the solder ball attachment machine of FIG. 2.

Referring to now FIG. 3, a side view to the attachment machine of FIG. 2 is shown. As seen therein, the reservoir 14 is formed into housing 12 such that solder balls contained in the reservoir may be smoothly rolled from the reservoir through a tapered mouth into the stencil receptacle area 16 to fill the array holes of the stencil. A vacuum chamber 28 is located beneath the stencil receptacle 16 which is attached to a vacuum apparatus 30 when using the optional vacuum assist. Further, an optional pattern recognition camera 31 for use in detecting missing solder balls in the stencil hole array may be mounted such that it has a clear view of the stencil hole array.

Figure 4:
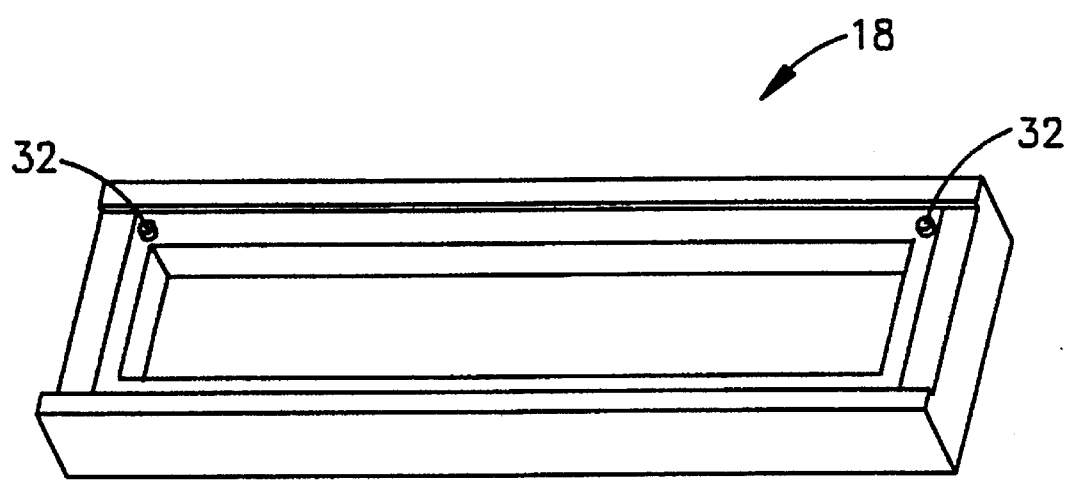
FIG. 4 is a diagrammatic perspective view of the stencil holder illustrated in FIG. 2.

FIG. 4 illustrates an perspective view of the stencil holder 18. The stencil holder unit fits into the stencil receptacle 16 of FIG. 2. Guide pins 32 are provided in the corners of the stencil holder. The stencil and substrate have preformed holes in corresponding corners that slip over the guide pins to compel proper alignment of the stencil relative to the substrate within the attachment machine. A lip or shelf formed around the edges of receptacle 16 such that the holder 18 is supported when inserted. When inserted into the receptacle 16, holder 18 is latched into place with an suitably latching mechanism (not shown). By way of example, the latching scheme may include a series of protrusions and matching holes formed on the holder and receptacle. The holder 18 can be conveniently unlatched at the appropriate time when the stencil is being changed. The holder 18 is designed to lock to the base while the strip is being removed after flipping over the machine.

Figure 5:
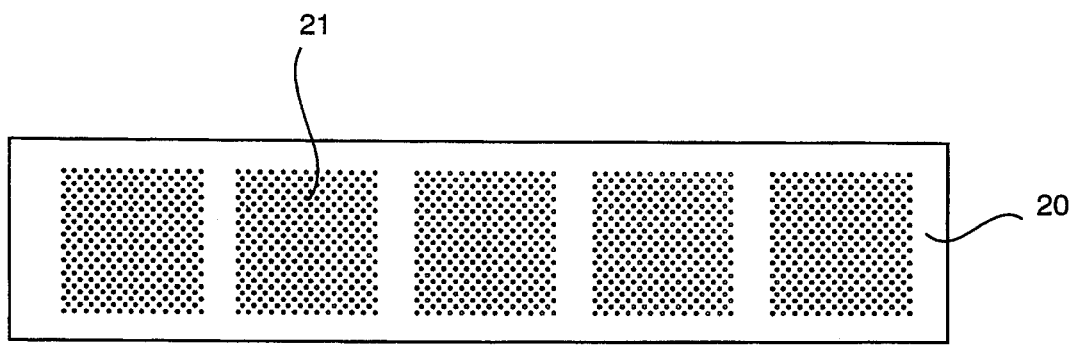
FIG. 5 is a diagrammatic top view of a stencil for use in the solder ball attachment machine of FIG. 2.

Referring to FIG. 5, a stencil strip 20 suitable for use with the attachment machine 10 of (FIG. 2) in accordance with the present invention will be described. An array of holes 21 are formed in a multiple unit stencil strip 20 where each unit corresponds to an array for a separate semiconductor package. Stencil 20 can be constructed by machine drilling the array holes 21 into a variety of metal or plastic plates. Other possibilities include multiple laminated stainless steel plates (dual) that are often used in the screen printing industry.

Figure 6A:
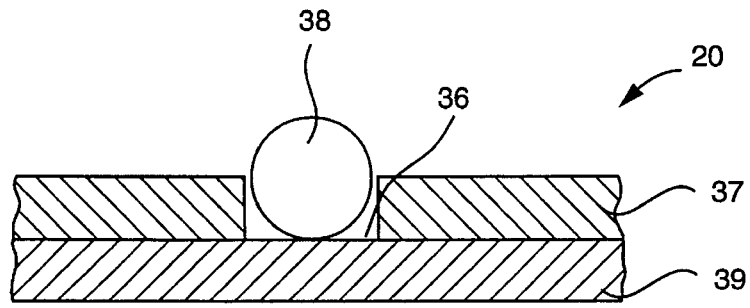
FIG. 6a is an enhanced side view of an individual hole in the stencil of FIG. 2 in accordance with a first embodiment formed by a dual plate configuration.

A wide variety of hole configurations may be used in the stencil. By way of example, FIG. 6a illustrates a configuration used when vacuum assist pickup is not used, that is, solder balls are positioned in holes by rotating or otherwise tilting the stencil until the balls "fall" into the holes. This procedure has the drawback of requiring the whole device or at least the stencil part of it to be movable. For this configuration where a hole must be formed, typically by drilling, partially through a single plate, it is difficult to drill and maintain the precise depths of the bores necessary. Furthermore, when partial boring, it has proven difficult to obtain smooth bottom surfaces of the holes at these small dimensions. Therefore it is easier to use a two piece arrangement whereby the first piece is drilled completely through and superimposed over and attached to a second undrilled piece.

Referring back to FIG. 6a, a stencil 20 in accordance to a first embodiment is shown. Array holes 21 are formed into a first plate 37 where the bore diameter in the plate 37 is slightly larger than the diameter of a solder ball 38 such that only one ball comfortably fits in hole 36. The depth of hole 36 is determined by the thickness of plate 37. The deeper the hole the more the balls tend to stay put once inside and it therefore has been found, by way of example, a depth of approximately one-half the diameter of the ball works well. Plate 37 is then superimposed over and attached to a second plate 39, effectively leaving a hole bored halfway into the combined stencil plates.

Figure 6B:
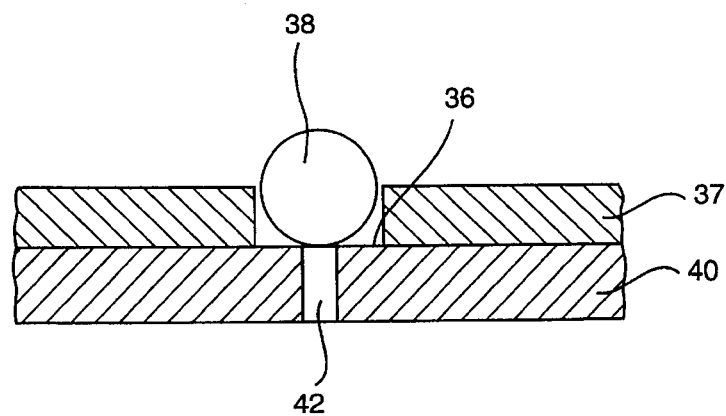
FIG. 6b is an enhanced side view of a second embodiment of a stencil hole having a vacuum conduit formed by a dual plate configuration.

Referring to FIG. 6b, an illustration of a bore configuration incorporating a vacuum assist conduit 42 is shown. In a single plate design, this can be accomplished by first boring the smaller conduit hole 42 through stencil 20 and then partially boring on top of the conduit 42 for the array hole 36 into a single plate (not shown). Again, for ease of manufacturing, it is simpler to use a two piece arrangement where the first plate 37 is drilled as in the embodiment in FIG. 6a. The second plate 40 is formed with an array of smaller conduit holes 42 completely through a second plate 40. The first plate 37 is then superimposed over and attached to plate 40 leaving the resulting configuration as shown in FIG. 6b.

During operation, a vacuum presented in conduit 42 has the effect of attracting and retaining any solder ball that may come within the vicinity of hole 36 thereby increasing the likelihood of filling the holes. Another advantage is that the balls are held in place in the event that the machine is moved or jarred. This is advantageous since precise alignment of the balls must be maintained prior to attachment.

Figure 7:
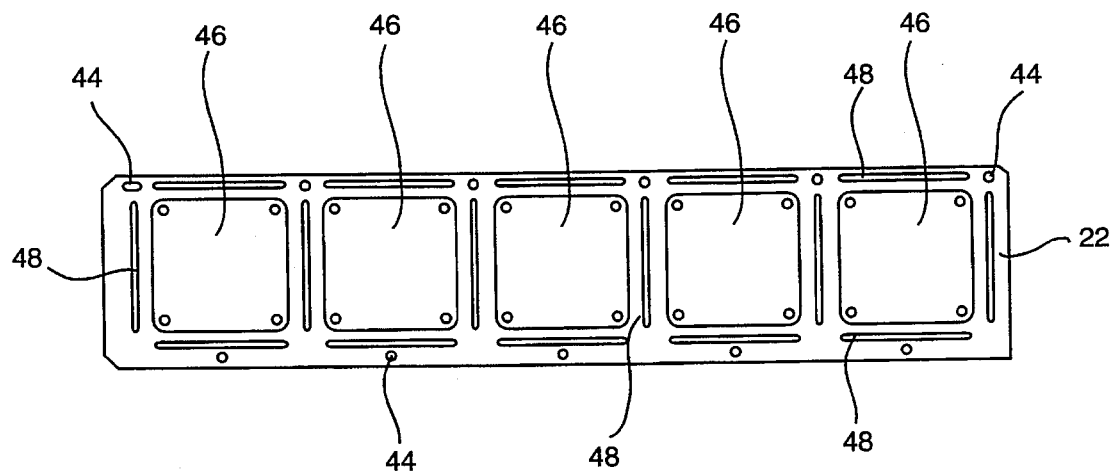
FIG. 7 is a diagrammatic top view of a molded substrate strip suitable for use in the present invention.

FIG. 7 illustrates a typical molded substrate strip 22 that can be used with the present invention. It has been found that a strip of contiguous units is an efficient configuration which aids processing with the automated equipment. The number of units per strip may vary but a number in the range of 3–8 units seems to strike a balance between being able to process multiple units continuously while maintaining a masonable defect rate which tends to increase with increasing numbers of units per strip. However, it should be appreciated that longer strips and substrates containing matrixes of units may be used as well.

There are a variety of materials from which substrates may be constructed from. The most important factor in the choice of material is that its glass transition temperature must be high enough to withstand the high processing temperatures during manufacturing. By way of example, Bismaleimid Triazine (BT rosin), which has a glass transition temperature of about 180° C., has been found to work well for BGA applications. The apparatus and stencil can be adapted for use with a variety of substrate unit configurations. By way of example, solder balls may be attached to single substrate units or the units may be formed into a panel configuration to provide more efficient packing factor for solder ball attachment.

Substrate strips are supplied by a number of companies such as Eastern Co. of Japan and Ibiden Co. of Japan. Holes 44 are punched or drilled near the edges of strip 20 so that the processing equipment can grasp and align the part during manufacturing. Stress relief slots 48 are punched or drilled periodically between units 46 which allow for expansion when subjected to the high processing temperatures during the molding operation. After the packages are formed, the units 46 are separated from the strip by a punching operation.

To operate the solder ball attachment machine, a stencil holder and a stencil (such as stencil 20 of FIG. 5) are placed in the receptacle 16 with the stencil being fitted into the stencil holder 18. The stencil may be inserted into the stencil holder either before or after the stencil holder has been placed into the housing 12 (as best seen in FIG. 2).

The reservoir 14 is filled with a supply of preformed solder balls 38 and the lids 24 and 26 are closed. The housing 12 may then be tilted to cause the solder balls to roll out of the reservoir 14 through its tapered mount and into the receptacle 16. Once a number of balls are in the receptacle, the housing may be tilted back and forth in a sluicing manner to cause the solder balls to fill the various array holes 21 in stencil 20. It should be appreciated that the optional vacuum assist would generally improve the rate at which the various holes are filled. Once all of the array holes have been filed, any solder balls that remain loose in the receptacle area are rolled back into the reservoir by tilting the housing in an appropriate manner. Visual inspection by an operator or a computer controlled camera system is then provided to make sure that the arrays are completely filled with balls. If not, corrective action can be taken at this point to fill the remaining holes by initiating the rolling process again. It should be appreciated that the described tilting actions may be done manually in a low cost system or using an appropriate tilting mechanism such as a tilt table 27. By way of example, the tilt table may pivot along a horizontal axis or it can move back and forth to provide a rocking motion. As will be appreciated by those skilled in the art, any suitable motion can be used that helps place the balls in the holes.

In some embodiments, a suitable prefluxed substrate strip 22 is inserted into the main station 12 after the solder balls have been placed on the stencil. In other embodiments, the substrate may be positioned above the stencil prior to the hole filling step. Regardless of which approach is used, the substrate is aligned with the stencil. In the embodiment shown, the alignment is facilitated by placing the alignment holes 44 over pegs 32. The process of feeding the substrates into the apparatus may be done manually, or by an automated feed mechanism (not shown) to increase efficiency. The balls 38 are then sandwiched between the stencil 20 and substrate 22 thereby forcing the balls to be aligned with the landing pads on the individual units 46 of the substrate 22.

In the described embodiment, flux is preapplied to the landing pads (not shown) of the substrate strip 22 to allow for the solder balls 38 to bond precisely to the substrate 22. The flux may be applied by a number of conventional methods such as screen printing, where a mask containing exposed areas in locations where the solder balls 38 are to be attached is aligned over the substrate strip 22 and pasted over with flux. The mask is then removed leaving flux deposited in the exposed areas in the pattern of an array in a relatively fast and efficient manner. Another way of applying flux is by a simple dotting process where flux is applied in each of the desired locations one at a time. Both techniques are conducive to automation and work equally well, although the screen printing technique may be most efficient for mass production.

An advantages of the system described above can be built at a relatively low cost compared to many of the machines currently available may cost in the hundreds of thousands of dollars, a factor of one hundred or more. Another advantage is that various levels of automation that can be incorporated into the machine to accommodate particular cost or production requirements. Also, the design eliminates the problem of clogged pickup heads from flux dipping prevalent in some prior art machines by performing a screen printing or dotting flux process instead. Further, efficiency is improved by the ability of the operator or camera system to detect defective packages with missing balls where corrective action can be taken on the spot. Still further, the apparatus of the present invention can be modified to mount solder balls for other types of packages such as Ceramic Ball Grid Array (CBGA), Plastic Quad Flat Pack (PQFP), Plastic Leaded Chip Carrier (PLCC), Ceramic Leaded Chip Carrier (CLCC), and Ceramic Quad Flat Packs (CQFP) by a simple stencil change and height adjustment thereby offering tremendous manufacturing flexibility.

While the invention has been described primarily in terms of a solder ball attachment apparatus for use with BGA packages, it should be understood that the invention may be applied to other types of packages that include substrates. Further while only one embodiment of the present invention has been described in detail, it should be understood that the present invention may be embodied in other specific forms without departing from the spirit or scope of the invention. Particularly, the apparatus may be designed to accept substrates in other forms such as a hole array in the form of a panel as opposed to strips. Therefore, the present examples are to be considered as illustrative and not restrictive, and the invention is not to be limited to the details given herein, but may be modified within the scope of the appended claims.

I claim:

1. A method of attaching solder balls to a substrate assembly for use in semiconductor package utilizing a solder ball attachment mechanism that includes a stencil having an array of holes thereon received in a stencil holder which together being received in said mechanism, said stencil having each stencil hole in the array adapted to receive a solder ball, the method comprising the steps of:

placing a substrate having an array of fluxed landing pads in the solder ball attachment machine wherein said array of landing pads are aligned with an associated hole array in the stencil;

rolling a multiplicity of solder balls over the stencil hole array such that each of the holes in the hole array are filled with a single associated solder ball; and attaching the solder balls that fill the stencil hole array to said landing pads using a soldering process.

2. A method of attaching solder balls to a substrate assembly according to claim 1 wherein said flux is applied by a screen printing process.

3. A method of attaching solder balls to a substrate assembly according to claim 1 wherein said flux is applied by a dotting process.

4. A method of attaching solder balls to a substrate assembly according to claim 1 wherein a solder ball attachment mechanism is attached to tilt table thereby providing automated movement to said mechanism to help facilitate in more efficient filling of the holes with solder balls.

5. A method of attaching solder balls to a substrate assembly according to claim 1 wherein a pattern recognition camera is used to detect any holes not filled by solder balls, wherein when the pattern recognition camera determines that at least one of the holes is not filled, the solder ball attaching step is not permitted to proceed.

6. A method of attaching solder balls to a substrate assembly according to claim 5 further comprising the corrective action step of reinitiating the rolling process when it is determined that at least one of the holes is not filled by an associated solder ball.

7. A method of attaching solder balls to a substrate assembly according to claim 1 wherein the distance between the stencil and the substrate is adjusted to accommodate different types of packages.

8. A method of attaching solder balls to a substrate assembly according to claim 1 wherein the substrate is intended for use in a Quad Flat Pack type ball grid array semiconductor package.

9. A method of packaging an integrated circuit die having a plurality of bond pads, comprising the steps of:

affixing the die to a substrate having a top surface and a bottom surface, said top surface having a plurality of conductive trace formed thereon;

electrically coupling the bond pads of the die to said conductive traces;

encapsulating the die and at least a portion of the substrate to seal the die from the ambient environment; and attaching an array of solder balls to the bottom surface of the substrate in accordance with the method recited in claim 3.

10. A method of packaging an integrated circuit die according to claim 9 wherein said package is a Ball Grid Array Package.

11. A method of packaging an integrated circuit die according to claim 9 wherein said package is selected from the group consisting of Ceramic Ball Grid Array, Plastic Quad Flat Pack, Plastic Leaded Chip Carrier, Ceramic Leaded Chip Carrier, and Ceramic Quad Flat Pack semiconductor packages.

12. A method of packaging an integrated circuit die according to claim 9 wherein the electrical coupling is performed by a wire bonder and bonding wires are used to electrically couple the bond pads to the conductive traces.

13. A method of packaging an integrated circuit die according to claim 9 wherein the encapsulating step is accomplished by molding a plastic encapsulating material over the die.

* * * * *